US008645774B2

(12) United States Patent
Louie et al.

(10) Patent No.: US 8,645,774 B2
(45) Date of Patent: Feb. 4, 2014

(54) EXPEDITED MEMORY DRIVE SELF TEST

(75) Inventors: Timothy J. Louie, Apex, NC (US); Adam Roberts, Moncure, NC (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 13/323,991

(22) Filed: Dec. 13, 2011

(65) Prior Publication Data

US 2013/0151913 A1 Jun. 13, 2013

(51) Int. Cl.
*G11C 29/00* (2006.01)

(52) U.S. Cl.
USPC .......................................... 714/718; 714/733

(58) Field of Classification Search
USPC ....... 365/201; 711/112; 713/2; 714/718, 733, 714/769, 773, 124; 705/10
See application file for complete search history.

(56) References Cited

U.S. PATENT DOCUMENTS

| | | | |
|---|---|---|---|
| 4,646,299 A | 2/1987 | Schinabeck et al. | |
| 5,764,878 A * | 6/1998 | Kablanian et al. | 714/6.11 |
| 6,618,682 B2 | 9/2003 | Bulaga et al. | |
| 6,667,918 B2 * | 12/2003 | Leader et al. | 365/201 |
| 6,988,232 B2 | 1/2006 | Ricchetti et al. | |
| 7,243,043 B2 | 7/2007 | Shin | |
| 7,334,159 B1 * | 2/2008 | Callaghan | 714/30 |
| 7,441,078 B1 * | 10/2008 | Sardella | 711/112 |
| 7,574,637 B2 | 8/2009 | Ricchetti et al. | |
| 7,730,293 B2 * | 6/2010 | Owhadi et al. | 713/2 |
| 2002/0036850 A1 * | 3/2002 | Lenny et al. | 360/31 |
| 2004/0057307 A1 * | 3/2004 | Fuhrmann et al. | 365/201 |
| 2005/0154950 A1 * | 7/2005 | Budiman et al. | 714/733 |
| 2005/0171831 A1 * | 8/2005 | Johnson et al. | 705/10 |
| 2005/0172269 A1 * | 8/2005 | Johnson et al. | 717/124 |

OTHER PUBLICATIONS

Philips Semiconductors, "Pre-Amplifier for Hard Disk Drive With MR-Read/Inductive Write Heads", Integrated Circuits Data Sheet TDA5360 Objective Specification Revision 2.2, Jul. 1998, pp. 1-35, Philips Corporation, USA.
Agarwal et al., "State Model for Scheduling Built-In Self-Test and Scrubbing in FPGA to Maximize the System Availability in Space Applications", 2010 India International Conference on Power Electronics (IICPE), Jan. 28-30, 2011, 7 pp., Institute of Electrical and Electronics Engineers (IEEE), Digital Object Identifier: 10.1109/IICPE.2011.5728146.

* cited by examiner

*Primary Examiner* — David Ton
(74) *Attorney, Agent, or Firm* — H. Barrett Spraggins; Katherine S. Brown; Biggers Kennedy Lenart Spraggins LLP

(57) ABSTRACT

Expedited memory drive self test, including: determining, by a drive self test module, a base block size for testing a memory drive; determining, by a drive self test module, a block group size for testing a memory drive; determining, by the drive self test module, a percentage of the memory drive to test; and for each block group size of memory in the memory drive: testing for media defects, by the drive self test module, a number of blocks in a block group that corresponds to the percentage of the memory drive to test.

19 Claims, 3 Drawing Sheets

EXPEDITED MEMORY DRIVE SELF TEST

BACKGROUND OF THE INVENTION

1. Field of the Invention

The field of the invention is data processing, or, more specifically, methods, apparatus, and products for expedited memory drive self test.

2. Description of Related Art

Manufacturing entities can test modern serial attached SCSI ('SAS') and Serial Advanced Technology Attachment ('SATA') drives to verify the physical state of media in the drive. Modern testing techniques can include a short test that is designed to complete in less than two minutes and checks out the electronics of the drives, the heads, and a cursory check of the media. Modern testing techniques can also include a long test that performs a full check of the media. As drive capacities have grown, the time required to test memory drives has also grown, thereby increasing manufacturing time/throughput or cost, to add additional equipment to preserve throughput.

SUMMARY OF THE INVENTION

Methods, apparatus, and products for expedited memory drive self test, including: determining, by a drive self test module, a base block size for testing a memory drive; determining, by a drive self test module, a block group size for testing a memory drive; determining, by the drive self test module, a percentage of the memory drive to test; and for each block group size of memory in the memory drive: testing for media defects, by the drive self test module, a number of blocks in a block group that corresponds to the percentage of the memory drive to test.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1:
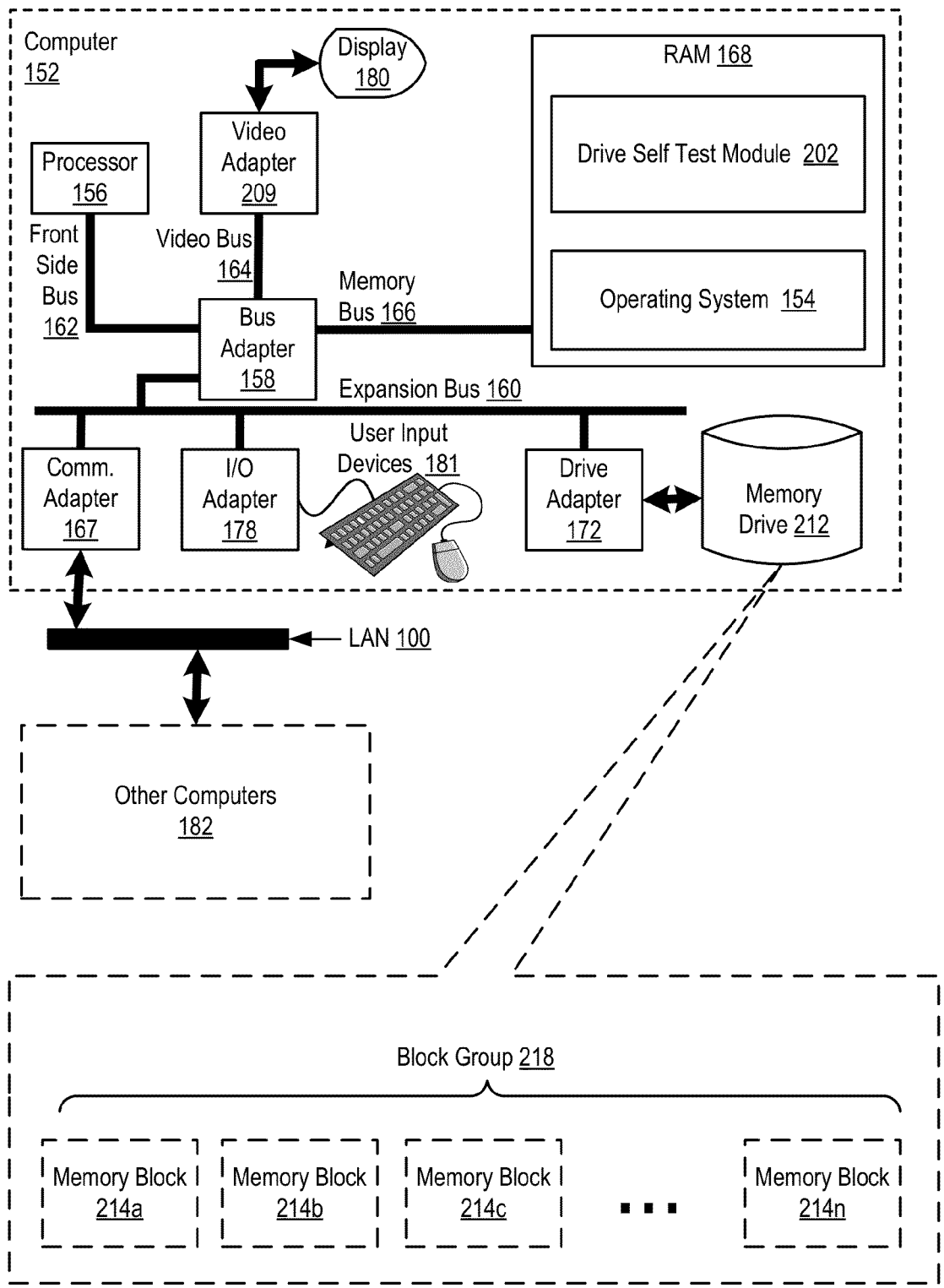
FIG. 1 sets forth a block diagram of automated computing machinery comprising an example computer useful in expedited memory drive self test according to embodiments of the present invention.

Example methods, apparatus, and products for expedited memory drive self test in accordance with the present invention are described with reference to the accompanying drawings, beginning with FIG. 1. FIG. 1 sets forth a block diagram of automated computing machinery comprising an example computer (152) useful in expedited memory drive self test according to embodiments of the present invention. The computer (152) of FIG. 1 includes at least one computer processor (156) or 'CPU' as well as random access memory (168) ('RAM') which is connected through a high speed memory bus (166) and bus adapter (158) to processor (156) and to other components of the computer (152).

Stored in RAM (168) is a drive self test module (212), a module of computer program instructions for testing memory drives according to embodiments of the present invention. The drive self test module (212) can test memory drives by determining a base block size for testing a memory drive (212). The base block size for testing a memory drive (212) represents an amount of memory that a memory drive (212) will logically be segmented into for the purposes of testing the memory drive (212). All computer memory in each block (214a, 214b, 214c, 214n) will either be tested during testing operations or untested during testing operations. No block (214a, 214b, 214c, 214n) will have portions that are tested and other portions that are untested. The drive self test module (212) can determining a base block size for testing a memory drive (212), for example, by determining the total capacity of the memory drive (212) and dividing the memory drive (212) into a predetermined number of logical blocks. For example, if the total capacity of a memory drive is 10 Gigabytes and the predetermined number of logical blocks desired is 1000, the base block size for testing a memory drive (212) will be set as 0.01 Gigabytes.

The drive self test module (212) can further test memory drives by determining a block group (218) size for testing the memory drive (212). The block group (218) represents a collection of memory blocks (214a, 214b, 214c, 214n). Within each block group (218), a portion of the memory blocks (214a, 214b, 214c, 214n) will be tested during memory testing operations and another portion of the memory blocks (214a, 214b, 214c, 214n) will not be tested during memory testing operations. Determining a block group (218) size for testing the memory drive (212) may be carried out in dependence upon the desired level of granularity for testing a memory drive (212). For example, if the desired level of granularity for testing a memory drive (212) is in intervals of 10%, the block group (218) size could be set to 10 memory blocks (214a, 214b, 214c, 214n) so that within each block group (218), 10% of the memory blocks could be tested by testing one block, 20% of the memory blocks could be tested by testing two blocks, 30% of the memory blocks could be tested by testing three blocks, and so on.

The drive self test module (212) can further test memory drives by determining a percentage of the memory drive (212) to test. The percentage of the memory drive (212) to test may be specified by a memory drive testing administrator. A memory drive (212) testing administrator may specify the percentage of the memory drive (212) to test, for example, through the use of a GUI that can accept input from the testing administrator and deliver the input to the drive self test module (202). In such a way, the testing administrator may determine how much of the memory drive (212) should be subjected to testing. By determining how much of the memory drive (212) should be subjected to testing, the testing administrator may save time during the testing process as the entire memory drive (212) is not tested, but also still test enough of the memory drive (212) to capture a significant portion of the problems with memory drive (212) or at least identify portions of the memory drive (212) at which more thorough testing may be needed.

The drive self test module (212) can further test memory drives by, for each block group (218) of memory in the memory drive (212), testing for media defects a number of blocks (214a, 214b, 214c, 214n) in the block group (218) that corresponds to the percentage of the memory drive (212) to test. Testing memory blocks (214a, 214b, 214c, 214n) for media defects may be carried out, for example, by writing data to all addresses in the memory drive (212) that correspond to the memory block (214a, 214b, 214c, 214n) being tested, reading data from the same addresses to verify that the data was written correctly, monitoring for error messages in response to the attempts to read and write data from addresses in the memory drive (212) that correspond to the memory block (214a, 214b, 214c, 214n) being tested, and so on.

Also stored in RAM (168) is an operating system (154). Operating systems useful expedited memory drive self test according to embodiments of the present invention include UNIX™, Linux™, Microsoft XP™, AIX™, IBM's i5/OS™, and others as will occur to those of skill in the art. The operating system (154) and drive self test module (212) in the example of FIG. 1 are shown in RAM (168), but many components of such software typically are stored in non-volatile memory also, such as, for example, on a disk drive.

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of memory drive drive (212). Disk drive adapters useful in computers for drive self test module (212) according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The example computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for drive self test module (212) according to embodiments of the present invention include modems for wired dial-up communications, Ethernet (IEEE 802.3) adapters for wired data communications network communications, and 802.11 adapters for wireless data communications network communications.

Figure 2:
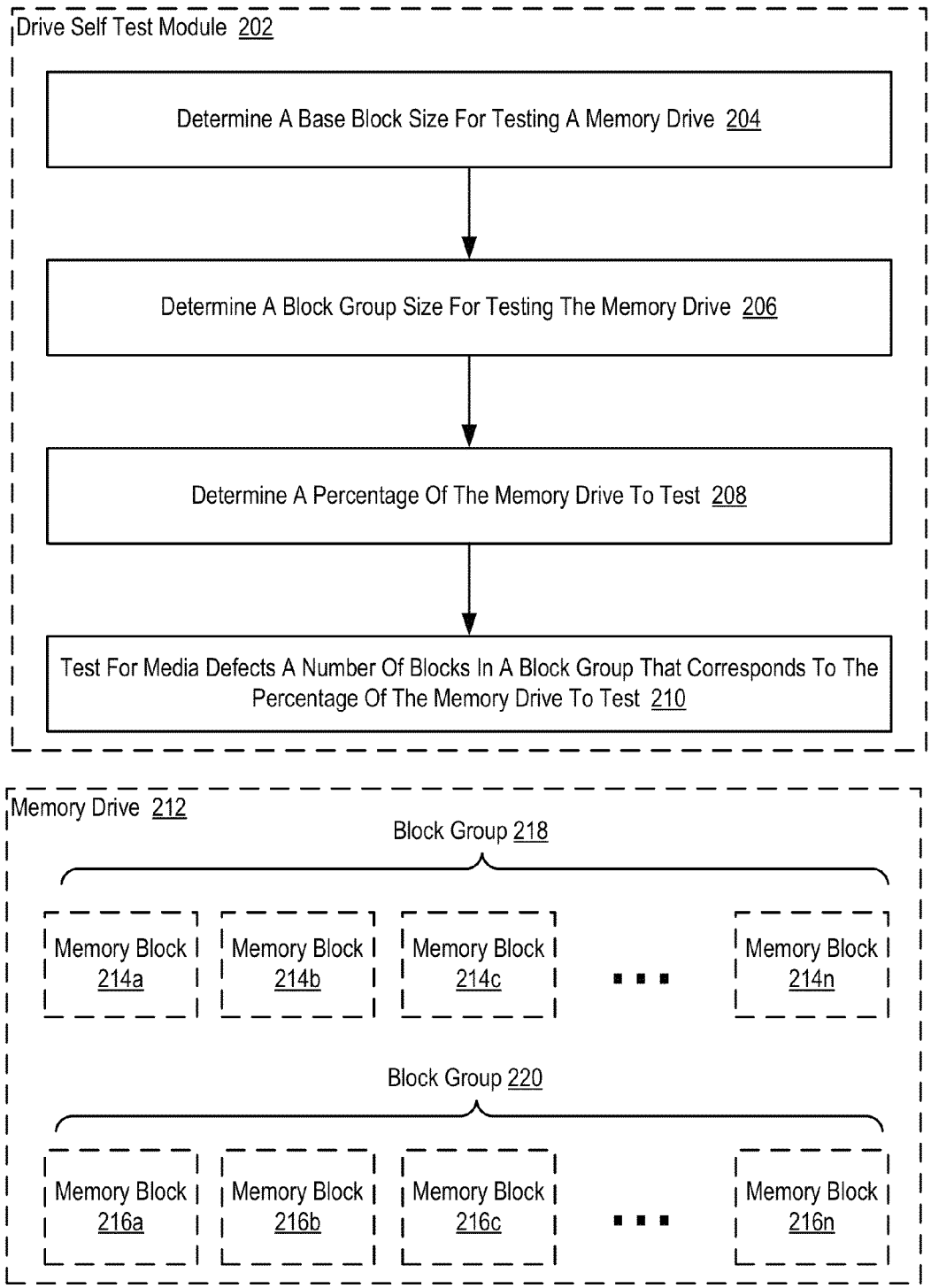
FIG. 2 sets forth a flow chart illustrating an example method for expedited memory drive self test according to embodiments of the present invention.

For further explanation, FIG. 2 sets forth a flow chart illustrating an example method for expedited memory drive self test according to embodiments of the present invention. The example method of FIG. 2 includes determining (204), by a drive self test module (202), a base block size for testing a memory drive (212). In the example method of FIG. 2, the base block size for testing a memory drive (212) represents an amount of memory that a memory drive (212) will logically be segmented into for the purposes of testing the memory drive (212). All computer memory in each block (214a, 214b, 214c, 214n, 216a, 216b, 216c, 216n) will either be tested during testing operations or untested during testing operations. No block (214a, 214b, 214c, 214n, 216a, 216b, 216c, 216n) will have portions that are tested and other portions that are untested.

In the example method of FIG. 2, determining (204) a base block size for testing a memory drive (212) may be carried out, for example, by determining the total capacity of the memory drive (212) and dividing the memory drive (212) into a predetermined number of logical blocks. For example, if the total capacity of a memory drive is 10 Gigabytes and the predetermined number of logical blocks desired is 1000, the base block size for testing a memory drive (212) will be set as 0.01 Gigabytes. Alternatively, determining (204) a base block size for testing a memory drive (212) may be specified by a memory drive (212) testing administrator. A memory drive (212) testing administrator may specify the base block size, for example, through the use of a graphical user interface ('GUI') that can accept input from the testing administrator and deliver the input to the drive self test module (202). In such a way, the testing administrator may determine the level of granularity that is desired when testing the memory drive (212).

The example method of FIG. 2 also includes determining (206), by a drive self test module (202), a block group (218, 220) size for testing the memory drive (212). In the example method of FIG. 2, a block group (218, 220) represents a collection of memory blocks (214a, 214b, 214c, 214n, 216a, 216b, 216c, 216n). Within each block group (218, 220), a portion of the memory blocks (214a, 214b, 214c, 214n, 216a, 216b, 216c, 216n) will be tested during memory testing operations and another portion of the memory blocks (214a, 214b, 214c, 214n, 216a, 216b, 216c, 216n) will not be tested during memory testing operations.

In the example method of FIG. 2, determining (206) a block group (218, 220) size for testing the memory drive (212) may be carried out in dependence upon the desired level of granularity for testing a memory drive (212). For example, if the desired level of granularity for testing a memory drive (212) is in intervals of 10%, the block group (218, 220) size could be set to 10 memory blocks (214a, 214b, 214c, 214n, 216a, 216b, 216c, 216n) so that within each block group (218, 220), 10% of the memory blocks could be tested by testing one block, 20% of the memory blocks could be tested by testing two blocks, 30% of the memory blocks could be tested by testing three blocks, and so on. In another embodiment, if the desired level of granularity for testing a memory drive (212) is in intervals of 1%, the block group (218, 220) size could be set to 100 memory blocks (214a, 214b, 214c, 214n, 216a, 216b, 216c, 216n) so that within each block group (218, 220), 1% of the memory blocks could be tested by testing one block, 2% of the memory blocks could be tested by testing two blocks, 3% of the memory blocks could be tested by testing three blocks, and so on.

In the example method of FIG. 2, the block group (218, 220) size for testing the memory drive (212) may also be specified by a memory drive testing administrator.

A memory drive (212) testing administrator may specify the block group (218, 220) size, for example, through the use of a GUI that can accept input from the testing administrator and deliver the input to the drive self test module (202). In such a way, the testing administrator may determine the level of granularity that is desired when testing the memory drive (212).

The example method of FIG. 2 also includes determining (208), by the drive self test module (202), a percentage of the memory drive (212) to test. In the example method of FIG. 2, percentage of the memory drive (212) to test may be specified by a memory drive testing administrator. A memory drive (212) testing administrator may specify the percentage of the memory drive (212) to test, for example, through the use of a GUI that can accept input from the testing administrator and deliver the input to the drive self test module (202). In such a way, the testing administrator may determine how much of the memory drive (212) should be subjected to testing. By determining how much of the memory drive (212) should be subjected to testing, the testing administrator may save time during the testing process as the entire memory drive (212) is not tested, but also still test enough of the memory drive (212) to capture a significant portion of the problems with memory drive (212) or at least identify portions of the memory drive (212) at which more thorough testing may be needed.

The example method of FIG. 2 also includes, for each block group (218, 220) of memory in the memory drive (212), testing (210) for media defects a number of blocks (214a, 214b, 214c, 214n, 216a, 216b, 216c, 216n) in the block group (218, 220) that corresponds to the percentage of the memory drive (212) to test. In the example method of FIG. 2, testing (210) memory blocks (214a, 214b, 214c, 214n, 216a, 216b, 216c, 216n) for media defects may be carried out, for example, by writing data to all addresses in the memory drive (212) that correspond to the memory block (214a, 214b, 214c, 214n, 216a, 216b, 216c, 216n) being tested, reading data from the same addresses to verify that the data was written correctly, monitoring for error messages in response to the attempts to read and write data from addresses in the memory drive (212) that correspond to the memory block (214a, 214b, 214c, 214n, 216a, 216b, 216c, 216n) being tested, and so on.

In the example method of FIG. 2, testing (210) for media defects is carried out for each block group (218, 220) of memory in the memory drive (212). For each block group (218, 220) of memory in the memory drive (212) that is tested (210), however, only a number of blocks (214a, 214b, 214c, 214n, 216a, 216b, 216c, 216n) in the block group (218, 220) that corresponds to the percentage of the memory drive (212) to test are subjected to testing (210). Consider an example in which the block group size is 10 memory blocks per block group (218, 220) and the percentage of the memory drive (212) to test is set to 20%. In such an example, only 2 memory blocks within each block group (218, 220) will be tested (210) for media defects. In such a way, testing less than the full capacity of the memory drive (212) can occur to save time during the testing process while still ensuring that the testing is not limited to just a localized portion of the memory drive (212).

Figure 3:
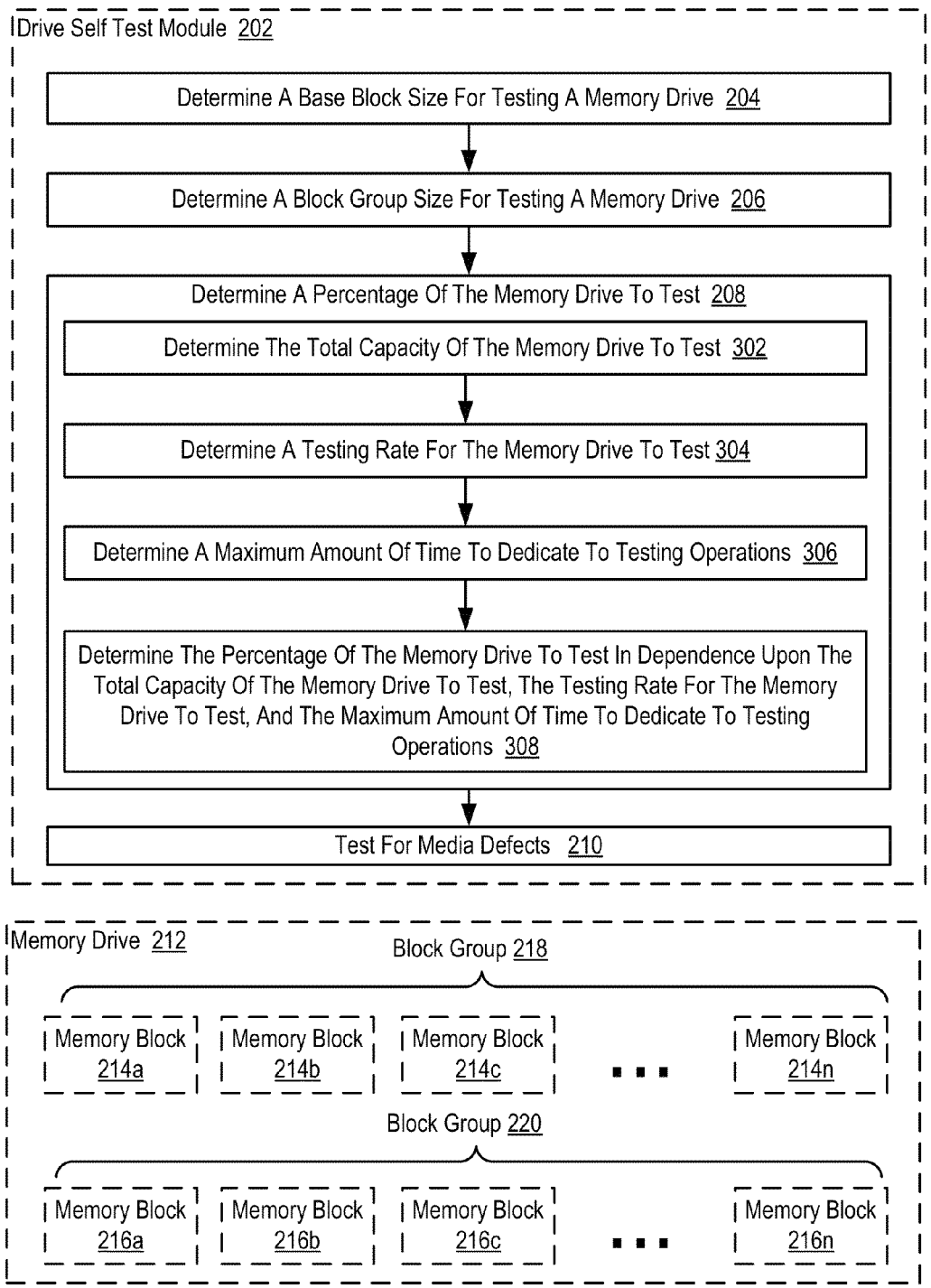
FIG. 3 sets forth a flow chart illustrating a further example method for expedited memory drive self test according to embodiments of the present invention.

For further explanation, FIG. 3 sets forth a flow chart illustrating a further example method for expedited memory drive self test according to embodiments of the present invention. The example method of FIG. 3 is similar to the example method of FIG. 2 as it also includes determining (204) a base block size for testing a memory drive (212), determining (206) a block group (218, 220) size for testing the memory drive (212), determining (208) a percentage of the memory drive (212) to test, and for each block group (218, 220) of memory in the memory drive (212), testing (210) for media defects a number of blocks (214a, 214b, 214c, 214n, 216a, 216b, 216c, 216n) in the block group (218, 220) that corresponds to the percentage of the memory drive (212) to test.

In the example method of FIG. 3, however, determining (208) a percentage of the memory drive (212) to test includes determining (302), by the drive self test module (202), the total capacity of the memory drive (212) to test. In the example method of FIG. 3, the total capacity of the memory drive (212) to test may be determined (208), for example, by examining vital product data associated with the memory drive (212), by receiving such information from a memory drive (212) testing administrator, and in other ways as will occur to those of skill in the art. The total capacity of the memory drive (212) may be specified in terms of bytes, gigabytes, the number of memory blocks of a particular block size, and so on.

In the example method of FIG. 3, determining (208) a percentage of the memory drive (212) to test can also include determining (304), by the drive self test module (202), a testing rate for the memory drive (212) to test. In the example method of FIG. 3, the testing rate represents the amount of memory in the memory drive (212) that can be tested per unit of time. The testing rate may be expressed, for example, as a number of bytes of memory that can be tested per second, as a number of memory blocks that can be tested per second, and so on. In the example method of FIG. 3, determining (304) a testing rate for the memory drive (212) to test may be carried out, for example, by performing testing operations on a predetermined amount of memory and recording the amount of time required to test the predetermined amount of memory, by performing testing operations for a predetermined period of time and determining the amount of memory that was tested in the predetermined period of time, and so on.

In the example method of FIG. 3, determining (208) a percentage of the memory drive (212) to test can also include determining (306), by the drive self test module (202), a maximum amount of time to dedicate to testing operations. The maximum amount of time to dedicate to performing testing operations may be specified by a memory drive (212) testing administrator. The maximum amount of time to dedicate to performing testing operations may be also determined by the drive self test module (202), for example, by determining through a job scheduler the amount of time available prior to the initiation of highly critical processing jobs, or in other ways as will occur to those of skill in the art.

In the example method of FIG. 3, determining (208) a percentage of the memory drive (212) to test can also include determining (308), by the drive self test module (202), the percentage of the memory drive (212) to test in dependence upon the total capacity of the memory drive (212) to test, the testing rate for the memory drive (212) to test, and the maximum amount of time to dedicate to testing operations. Consider an example in which the total capacity of the memory drive (212) is 10000 memory blocks, the testing rate for the memory drive (212) is 100 memory blocks per minute, and the maximum amount of time to dedicate to testing operations is 10 minutes. In such an example, since 100 memory blocks may be tested per minute for 10 minutes, the total number of memory blocks that can be tested in the allotted time frame is 1000 memory blocks. In view of the fact that the total capacity of the memory drive (212) is 10000 memory blocks, the amount of memory blocks that can be tested in the allotted time frame represents 10% of the memory drive (212). In such an example, the drive self test module (202) would therefore determine (208) that the percentage of the memory drive (212) to test is 10%.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of expedited memory drive self test, the method comprising:
   determining, by a drive self test module, a base block size for testing a memory drive;
   determining, by a drive self test module, a block group size for testing the memory drive;
   determining, by the drive self test module, a percentage of the memory drive to test; and
   for each block group of memory in the memory drive:
   testing for media defects, by the drive self test module, a number of blocks in the block group that corresponds to the percentage of the memory drive to test.

2. The method of claim 1 wherein the base block size for testing the memory drive is specified by a memory drive testing administrator.

3. The method of claim 1 wherein the percentage of the memory drive to test is specified by a memory drive testing administrator.

4. The method of claim 1 wherein determining, by the drive self test module, a percentage of the memory drive to test further comprises:
   determining, by the drive self test module, the total capacity of the memory drive to test;
   determining, by the drive self test module, a testing rate for the memory drive to test;
   determining, by the drive self test module, a maximum amount of time to dedicate to performing testing operations; and
   determining, by the drive self test module, the percentage of the memory drive to test in dependence upon the total capacity of the memory drive to test, the testing rate for the memory drive to test, and the maximum amount of time to dedicate to testing operations.

5. The method of claim 1 wherein testing for media defects, by the drive self test module, a number of blocks in the block group that corresponds to the percentage of the memory drive to test further comprises performing write operations to blocks under test.

6. The method of claim 1 wherein testing for media defects, by the drive self test module, a number of blocks in the block group that corresponds to the percentage of the memory drive to test further comprises performing read operations from blocks under test.

7. An apparatus for expedited memory drive self test, the apparatus comprising a computer processor, a computer memory operatively coupled to the computer processor, the computer memory having disposed within it computer program instructions that, when executed by the computer processor, cause the apparatus to carry out the steps of:
   determining, by a drive self test module, a base block size for testing a memory drive;
   determining, by a drive self test module, a block group size for testing the memory drive;
   determining, by the drive self test module, a percentage of the memory drive to test; and
   for each block group of memory in the memory drive:
   testing for media defects, by the drive self test module, a number of blocks in the block group that corresponds to the percentage of the memory drive to test.

8. The apparatus of claim 7 wherein the base block size for testing the memory drive is specified by a memory drive testing administrator.

9. The apparatus of claim 7 wherein the percentage of the memory drive to test is specified by a memory drive testing administrator.

10. The apparatus of claim 7 wherein determining, by the drive self test module, a percentage of the memory drive to test further comprises:
    determining, by the drive self test module, the total capacity of the memory drive to test;
    determining, by the drive self test module, a testing rate for the memory drive to test;
    determining, by the drive self test module, a maximum amount of time to dedicate to performing testing operations; and
    determining, by the drive self test module, the percentage of the memory drive to test in dependence upon the total capacity of the memory drive to test, the testing rate for the memory drive to test, and the maximum amount of time to dedicate to testing operations.

11. The apparatus of claim 7 wherein testing for media defects, by the drive self test module, a number of blocks in the block group that corresponds to the percentage of the memory drive to test further comprises performing write operations to blocks under test.

12. The apparatus of claim 7 wherein testing for media defects, by the drive self test module, a number of blocks in the block group that corresponds to the percentage of the memory drive to test further comprises performing read operations from blocks under test.

13. A computer program product for expedited memory drive self test, the computer program product disposed upon a non-transitory computer readable storage medium, the computer program product comprises computer program instructions that, when executed, cause a computer to carry out the steps of:
    determining, by a drive self test module, a base block size for testing a memory drive;
    determining, by a drive self test module, a block group size for testing the memory drive;
    determining, by the drive self test module, a percentage of the memory drive to test; and
    for each block group of memory in the memory drive:
    testing for media defects, by the drive self test module, a number of blocks in the block group that corresponds to the percentage of the memory drive to test.

14. The computer program product of claim 13 wherein the base block size for testing the memory drive is specified by a memory drive testing administrator.

15. The computer program product of claim 13 wherein the percentage of the memory drive to test is specified by a memory drive testing administrator.

16. The computer program product of claim 13 wherein determining, by the drive self test module, a percentage of the memory drive to test further comprises:
    determining, by the drive self test module, the total capacity of the memory drive to test;
    determining, by the drive self test module, a testing rate for the memory drive to test;
    determining, by the drive self test module, a maximum amount of time to dedicate to performing testing operations; and
    determining, by the drive self test module, the percentage of the memory drive to test in dependence upon the total capacity of the memory drive to test, the testing rate for the memory drive to test, and the maximum amount of time to dedicate to testing operations.

17. The computer program product of claim 13 wherein testing for media defects, by the drive self test module, a number of blocks in the block group that corresponds to the percentage of the memory drive to test further comprises performing write operations to blocks under test.

18. The computer program product of claim 13 wherein testing for media defects, by the drive self test module, a number of blocks in the block group that corresponds to the percentage of the memory drive to test further comprises performing read operations from blocks under test.

19. The computer program product of claim 13 wherein the computer readable medium further comprises a computer readable storage medium.

* * * * *